United States Patent [19]

Tani

[11] Patent Number: 5,396,615
[45] Date of Patent: Mar. 7, 1995

[54] SYSTEM FOR SIMULATING ELECTRICAL DELAY CHARACTERISTICS OF LOGIC CIRCUITS

[75] Inventor: Takahiro Tani, Itami, Japan

[73] Assignee: Mitsubishi Denki Kabushiki Kaisha, Tokyo, Japan

[21] Appl. No.: 924,518

[22] Filed: Aug. 4, 1992

[30] Foreign Application Priority Data

Aug. 6, 1991 [JP] Japan .................. 3-196571

[51] Int. Cl.⁶ .......................... G06F 15/31
[52] U.S. Cl. ............... 395/500; 364/DIG. 2; 364/916.3
[58] Field of Search ............... 395/DIG. 1 MS File, 395/DIG. 2 MS File, 325, 500, 550, 575, 775, 800; 371/15.1, 16.1, 16.2, 22.1, 22.5, 22.6, 23, 28, 29, 30; 364/480, 481, 482, 488, 489, 490; 340/527, 528, 529, 530

Primary Examiner—Robert B. Harrell
Attorney, Agent, or Firm—Leydig, Voit & Mayer

[57] ABSTRACT

A timing simulation system has a layout pattern data storage portion, a data extracting portion, a process parameter storage portion, a gain coefficient calculating portion, an attendant capacitance supply portion, and a timing simulation executing portion. The gain coefficient calculating portion and the attendant capacitance calculating portion calculate gain coefficients and attendant capacitances peculiar to elements and wires from the circuit connection data extracted from layout pattern data of a logic circuit, and the gain coefficient supply portion and the attendant capacitance supply portion set the gain coefficients and the attendant capacitances. The timing simulation executing portion calculates the total load capacitance and the total gain coefficient with respect to a group of equipotential wires in which the signal value changes, calculates the transition time of the signal value on the wires based on the total load capacitance and the total gain coefficient, and executes timing simulation while using the transition time as a signal propagation delay time.

8 Claims, 8 Drawing Sheets

SYSTEM FOR SIMULATING ELECTRICAL DELAY CHARACTERISTICS OF LOGIC CIRCUITS

BACKGROUND OF THE INVENTION

1. Field of the Invention

The present invention relates to a timing simulation system for verifying the circuit operating characteristics and the electrical delay characteristics of a layout pattern of a logic circuit.

2. Description of the Related Art

FIG. 6 is a block diagram of a conventional timing simulation system. A layout pattern data storage portion 1 for storing layout pattern data equivalent to a logic circuit is connected to a data extracting portion 2 for extracting circuit constant data and wiring area data from the layout pattern data. The data extracting portion 2 is connected to a circuit constant data storage portion 3 and a wiring area data storage portion 4 for storing the extracted circuit constant data and wiring area data, respectively. The circuit constant data storage portion 3 and the wiring area data storage portion 4 are connected to a delay value calculating portion 7 for calculating a delay to be set in each of gate elements constituting a logic circuit. Furthermore, the delay value calculating portion 7 is connected to a process parameter storage portion 5 for storing various process parameters which are necessary for the production of the logic circuit, and an operating condition data storage portion 6 for storing operation condition data, such as a supply voltage v, an ambient temperature t and a dispersion variable p of processes carried out in production.

On the other hand, a circuit diagram input portion 8 for inputting circuit diagram data equivalent to the logic circuit and a circuit connection data supply portion 9 for creating circuit connection data are connected to each other. The circuit connection data supply portion 9 is connected to a circuit connection data storage portion 11. The delay value calculating portion 7 is connected to a delay value supply portion 10 for setting the calculated delay in an applicable gate element in the circuit connection data, and the delay value supply portion 10 is connected to the circuit connection data storage portion 11. Furthermore, the circuit connection data storage portion 11 is connected to a logic simulation executing portion 13 for conducting logic simulation on a circuit model where each element has a delay value peculiar thereto. The logic simulation executing portion 13 is connected to an input pattern data storage portion 12 for storing test pattern data to be input to the circuit connection data, and a simulation result output portion 14 for displaying the simulation result, such as signal value change information.

Operation of the conventional timing simulation system will now be described with reference to FIGS. 7 and 8. FIG. 7 is a circuit diagram of a logic circuit as a component of a large-scale digital circuit to be simulated. Referring to FIG. 7, the logic circuit is composed of PMOS transistors G1, G4 and G6, NMOS transistors G2, G3, G5 and G7, input signal lines N1, N2 and N3 of the transistors G1, G2 and G3, respectively, an internal signal line N4 connected to a contact of the transistors G1 and G2, and an internal signal line N5 connected to a contact of the transistors G2 and G3.

FIG. 8 shows layout pattern data corresponding to a part of the logic circuit shown in FIG. 7. The layout pattern data shown in FIG. 8 includes diffusion regions 15 and 16, polysilicon regions 17 and 18, an aluminum (Al) wiring region 19, contact regions 20 and 21, and gate forming regions 22 and 23 of transistors Q1 and Q2 where the diffusion regions 15 and 16 are overlaid on the polysilicon regions 17 and 18, respectively. The transistors Q1 and Q2 each correspond to any pair of the transistors G1 to G7 shown in FIG. 7.

If the circuit designer inputs the circuit diagram data shown in FIG. 8 from the circuit diagram input portion 8 shown in FIG. 6, the circuit connection data supply portion 9 obtains circuit connection data from the input circuit diagram data, and stores the circuit connection data in the circuit connection data storage portion 11. Subsequently, layout pattern data is created and stored in the layout pattern data storage portion 1. Circuit constant data and wiring area data are extracted from the layout pattern data by the data extracting portion 2, and stored in the circuit constant data storage portion 3 and the wiring area data storage portion 4, respectively. As the circuit constant data, for example, the channel length $L_1$ and the channel width $W_1$ of the transistor Q1 shown in FIG. 8 are extracted, and as the wiring area data, for example, the width $a_1$ and the length $b_1$ of the drain diffusion region 15a of the transistor Q1, the area $A_M$ of the aluminum wiring region 19, the area $A_P$ of the polysilicon region 18, and the area $A_{G2}$ of the gate of the transistor Q2, are extracted.

Then, the delay value calculating portion 7 reads the circuit constant data and the wiring area data out of the circuit constant data storage portion 3 and the wiring area data storage portion 4, reads process parameters and operating condition data stored in the process parameter storage portion 5 and the operating condition data storage portion 6, and substitutes the above data in a general delay calculating expression, thereby calculating a delay d. The delay value supply portion 10 sets the calculated delay d as the delay of the transistor Q1 in the circuit connection data.

By executing the above-mentioned processes, that is, the extraction of the circuit constant data and the wiring area data and the calculation and supply of the delay, circuit connection data including a delay is created as shown in the following Table 1.

TABLE 1

| GATE=G1, | ETYPE=P, | G=N1, | SD=VDD, | SD=N4, | DELAY=d1; |
|---|---|---|---|---|---|
| GATE=G2, | ETYPE=N, | G=N2, | SD=N4, | SD=N5, | DELAY=d2; |
| GATE=G3, | ETYPE=N, | G=N3, | SD=N5, | SD=GND, | DELAY=d3; |
| \| | \| | \| | \| | \| | \| |
| 31 | 32 | 33 | 34 | 35 | 36 |

In Table 1, numerals 31 and 32 denote a gate name peculiar to an element, and a type of the element, respectively. P and N designate a PMOS transistor and an NMOS transistor, respectively. Numerals 33, 34 and 35 denote signal lines (nets) connected to a gate terminal, a source terminal and a drain terminal of the element. Numeral 36 denotes a delay for the element.

Subsequently, the logic simulation executing portion 13 executes a logic simulation based on the circuit connection data with the delays shown in the above Table 1 and test pattern data for function evaluation stored in the input pattern data storage portion 12, and the simulation result output portion 14 displays the result of the simulation, such as signal change information, to the circuit designer.

If a transistor element as a component of an actual circuit operates at the switch level, that is, functions as a pass gate, since a group of nets which become equivalent in potential in response to ON/OFF switching of the transistor dynamically change, the total load capacity of the nets also changes dynamically. As a result, the total gain coefficient of transistors for driving such nets, and the signal value propagation delay value among the transistor elements also dynamically change.

However, in the case of the above-mentioned prior art which verifies the dynamic characteristics of a large scale digital circuit at high speed, a delay corresponding to layout pattern information is first calculated, and set as a constant peculiar to elements constituting the circuit, and then operation of the circuit is simulated. Therefore, it is difficult to simulate a precise delay.

For example, if a logical signal value changes from 0 to 1 on the input signal line N3 in the circuit shown in FIG. 7 and thus an output signal value of the transistor G3, that is, a signal on the net N5 changes, a signal value propagation delay time $d_t$ with respect to the transistors G6 and G7 in the next stage varies in accordance with whether the transistor G2 connected to the net N5 is ON. However, since the delay time is set as a constant peculiar to the transistor G3 in the conventional timing simulation system, actual operation of the circuit cannot be simulated precisely.

SUMMARY OF THE INVENTION

Accordingly, an object of the present invention is to provide a timing simulation system for high-precision timing simulation of a logic circuit having an element operating at the switch level.

In order to achieve the above object, according to a first aspect of the present invention, there is provided a timing simulation system comprising: a layout pattern data storage portion for storing layout pattern data defining a layout pattern of a logic circuit; a data extracting portion for extracting circuit connection data defining the connection of elements constituting the logic circuit, circuit constant data of the elements and wiring area data including dimensions of the diffusion regions of the elements and dimensions of the wires between the elements from the layout pattern data stored in the layout pattern data storage portion; a process parameter storage portion for storing process parameters necessary for production of the logic circuit; a gain coefficient calculating portion for calculating gain coefficients of the elements based on the circuit constant data extracted by the data extracting portion and the process parameters stored in the process parameter storage portion; an attendant capacitance calculating portion for calculating capacitances of the wires based on the wiring area data extracted by the data extracting portion and the process parameters stored in the process parameter storage portion; a gain coefficient supply portion for supplying the gain coefficients calculated by the gain coefficient calculating portion to the elements in the circuit connection data extracted by the data extracting portion; an attendant capacitance supply portion for supplying the capacitances calculated by the attendant capacitance calculating portion of the wires in the circuit connection data extracted by the data extracting portion; and a timing simulation executing portion for calculating the total load capacitances of equipotential wires which dynamically change in accordance with the on/off state of the elements and the total gain coefficient of elements for driving the wires when input signals are applied with respect to the circuit connection data supplied with the gain coefficient and the attendant capacitances by the gain coefficient supply portion and the attendant capacitance supply portion, for dynamically calculating a transition time of a signal value state generated on the wires according to the operation of the circuit, and for timing simulation while regarding the transition time as a delay time necessary for propagation of the logic signal value to an element in the next stage.

According to a second aspect of the present invention, there is provided a timing simulation system comprising: a circuit diagram input portion for inputting circuit diagram data equivalent to a logic circuit; a data supply portion for supplying circuit constant data of elements constituting the logic circuit and capacitances of wires between the elements to the circuit diagram data input by the circuit diagram input portion; a data extracting portion for extracting circuit connection data defining the connecting relation among the elements from the circuit diagram data input by the circuit diagram input portion; a process parameter storage portion for storing process parameters necessary for production of the logic circuit; a gain coefficient calculating portion for calculating gain coefficients of the elements based on the circuit constant data supplied by the data supply portion and the process parameter supplied by the process parameters storage portion; a gain coefficient supply portion for supplying the gain coefficients calculated by the gain coefficient calculating portion to the elements in the circuit connection data extracted by the data extracting portion; and a timing simulation executing portion for calculating the total load capacitances of equipotential wires which dynamically change in accordance with the on/off state of the elements and the total gain coefficient of a group of elements for driving the wires when input signals are applied with respect to the circuit connection data supplied with the attendant capacitances and the gain coefficients by the attendant capacitance supply portion and the gain coefficient supply portion, for dynamically calculating a transition time of a signal value state generated on the wires according to the operation of the circuit, and for executing timing simulation while regarding the transition time as a delay time necessary for propagation of the logic signal value to an element in the next stage.

In the timing simulation system according to the first aspect of the present invention, the gain coefficient calculating portion and the attendant capacitance calculating portion calculate the gain coefficients and the attendant capacitances peculiar to the elements and the wires in the circuit connection data, and the gain coefficient supply portion and the attendant capacitance supply portion set the gain coefficients and the attendant capacitances. The timing simulation executing portion calculates the total load capacitance and the total gain coefficient with respect to a group of equipotential wires in each of which a signal value changes, calculates the transition time of the signal value state on the wires based on the total load capacitance and the total gain coefficient, and executes timing simulation while regarding the transition time as a signal propagation delay time.

In the timing simulation system according to the second aspect of the present invention, the gain coefficient calculating portion calculates gain coefficients peculiar to elements in the circuit connection data and the gain coefficient supply portion sets the gain coefficients. The timing simulation executing portion calculates the total load capacitance and the total gain coefficient with respect to a group of equipotential wires in each of which a signal value changes, calculates the transition time of the signal value state on the wires based on the total load capacitance and the total gain coefficient, and executes timing simulation while regarding the transition time as a signal propagation delay time.

DESCRIPTION OF THE PREFERRED EMBODIMENTS

Preferred embodiments of the present invention will now be described with reference to the accompanying drawings.

Figure 1:
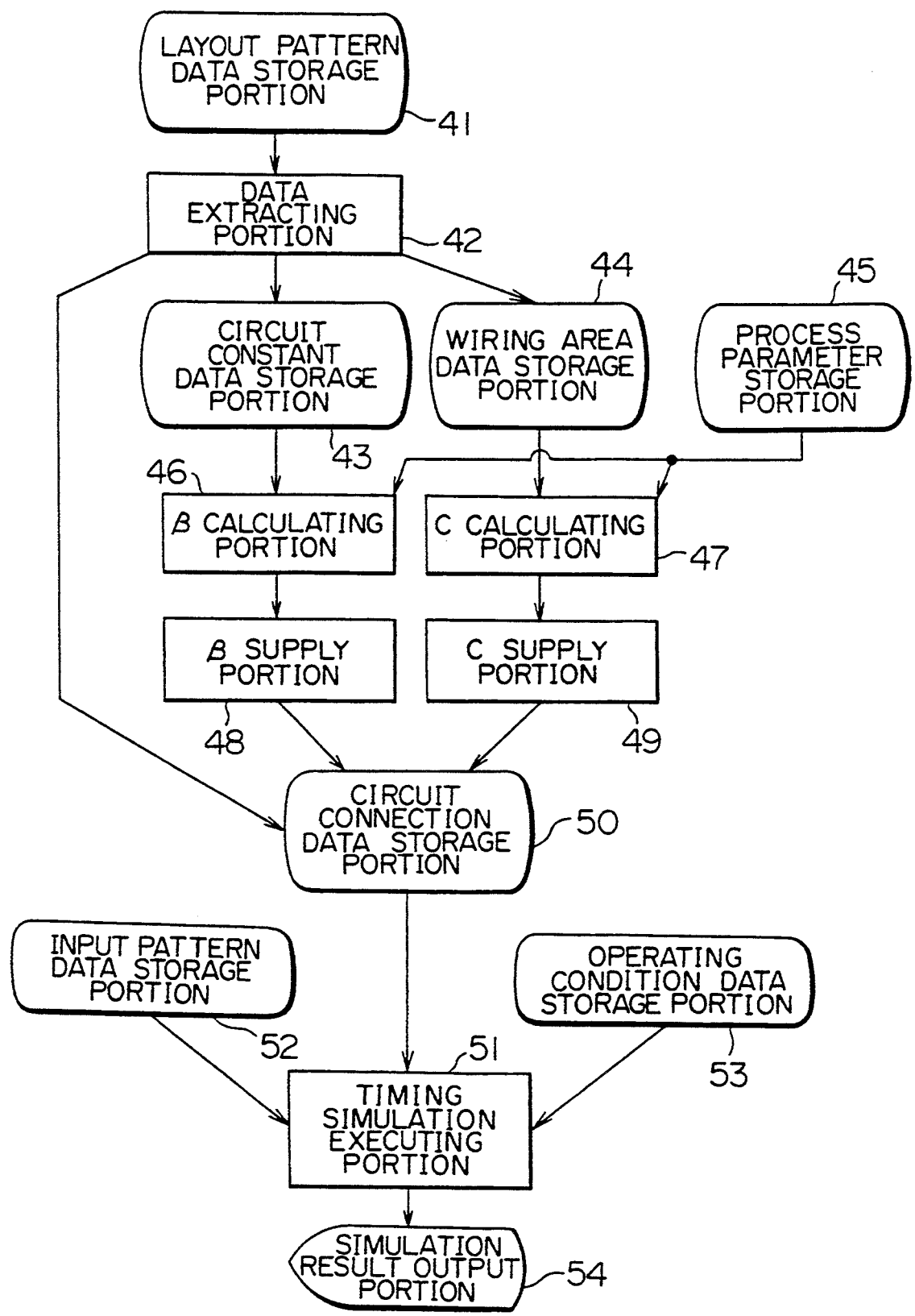
FIG. 1 is a block diagram of a timing simulation system according to a first embodiment of the present invention.

FIG. 1 is a block diagram of a timing simulation system according to a first embodiment of the present invention. A layout pattern data storage portion 41 for storing a layout pattern which is built in a computer and equivalent to a logic circuit is connected to a data extracting portion 42. The data extracting portion 42 extracts circuit connection data defining the connections among transistor elements constituting the logic circuit, circuit constants of the elements and wiring area data including dimensions of diffusion regions of the elements and dimensions of wires among the elements, from the layout pattern data. The data extracting portion 42 is connected to a circuit constant data storage portion 43 and a wiring area data storage portion 44 for storing the extracted circuit constant data and wiring area data, respectively.

A process parameter storage portion 45 stores various process parameters necessary for the production process of the logic circuit. The parameter storage portion 45 and the circuit constant data storage portion 43 are connected to a $\beta$ calculating portion 46 for calculating a transistor gain coefficient $\beta_i$ of a transistor element Gi (i=1, 2, ... ) based on the process parameters and the circuit constant data. Furthermore, the process parameter storage portion 45 and the wiring area data storage portion 44 are connected to a C calculating portion 47 for calculating a capacitance Cj of a net Nj (j=1, 2, ... ) based on the process parameters and the wiring area data. The capacitance Cj includes the capacitance of a metal and polysilicon contained in the net Nj, and a drain diffusion capacitance, a source diffusion capacitance and a gate capacity of a transistor element joined to the net Nj. Furthermore, the $\beta$ calculating portion 46 and the C calculating portion 47 are connected to a $\beta$ supply portion 48 for setting the calculated gain coefficient $\beta_i$ as a property value peculiar to the transistor element Gi in the circuit connection data and a C supply portion 49 for setting the calculated attendant capacitance Cj as a property value peculiar to the net Nj in the circuit connection data, respectively.

The data extracting portion 42, the $\beta$ supply portion 48 and the C supply portion 49 are connected to a circuit connection data storage portion 50. An input pattern data storage portion 52 for storing test pattern data for logic circuit evaluation to be input to the circuit connection data, and an operating condition data storage portion 53 for storing operating condition data, such as a supply voltage v, an ambient temperature t and a process dispersion variable p of the production process, are mounted, and a timing simulation executing portion 51 is connected to the circuit connection data storage portion 50, the input pattern data storage portion 52 and the operating condition storage portion 53. The timing simulation executing portion 51 executes timing simulation with respect to the circuit connection data stored in the circuit connection data storage portion 50, and calculates the total load capacitances $C_{total}$ of a group of equipotential wires which dynamically change according to the on/off state of the transistor element and the total gain coefficient $\beta_{total}$ of a group of elements for driving the wires based on the test pattern data stored in the input pattern data storage portion 52. Furthermore, the timing simulation executing portion 51 sequentially and dynamically calculates the transition time of a signal value state on the wires, that is, the fall and rise times in accordance with operation of the circuit, and carries out timing simulation by using the transition time as a delay time required to propagate the logic signal value to an element in the next stage. A simulation result output portion 54 for displaying the result of the simulation, such as signal value change information, is connected to the timing simulation executing portion 51.

Figure 3:
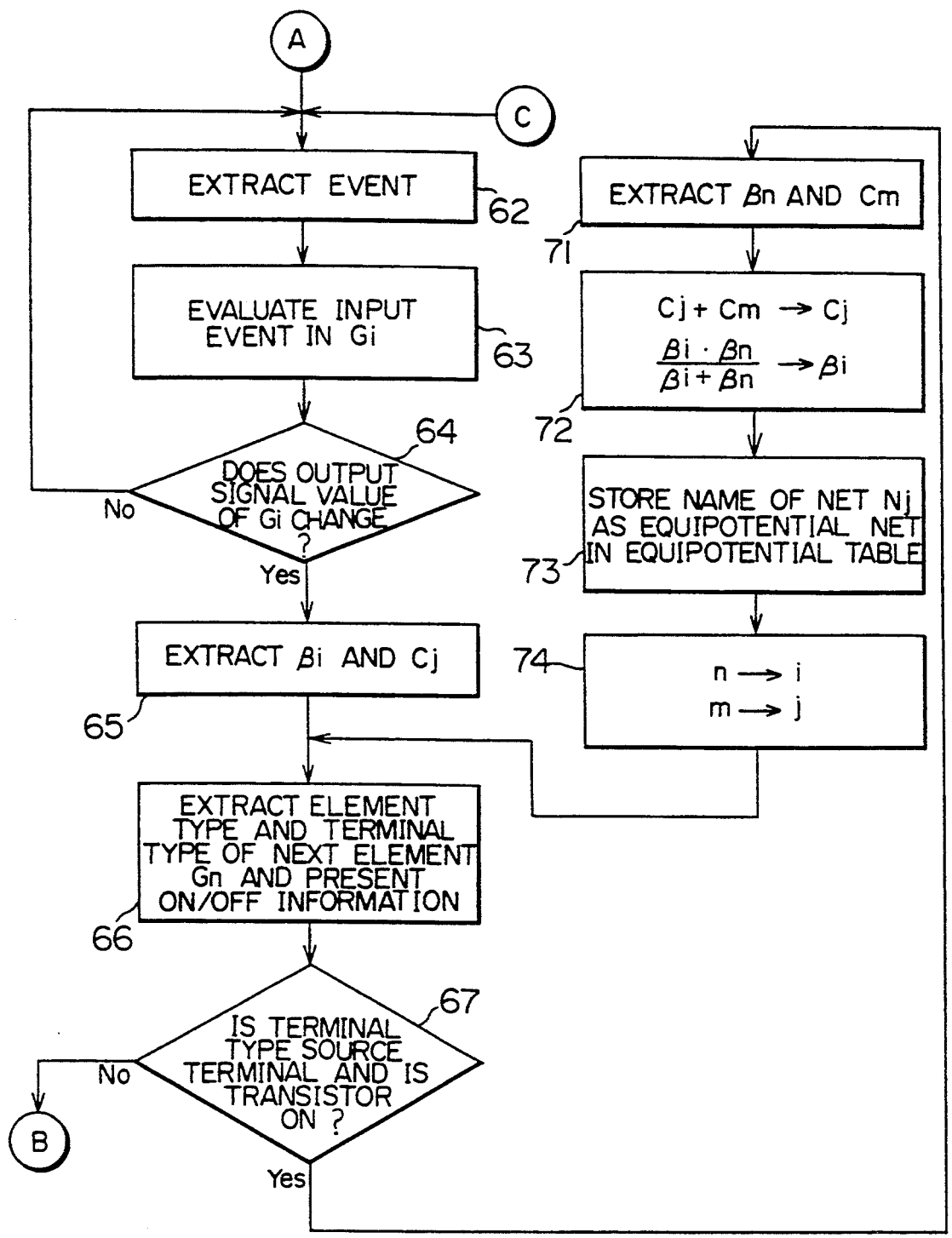
Figure 4:
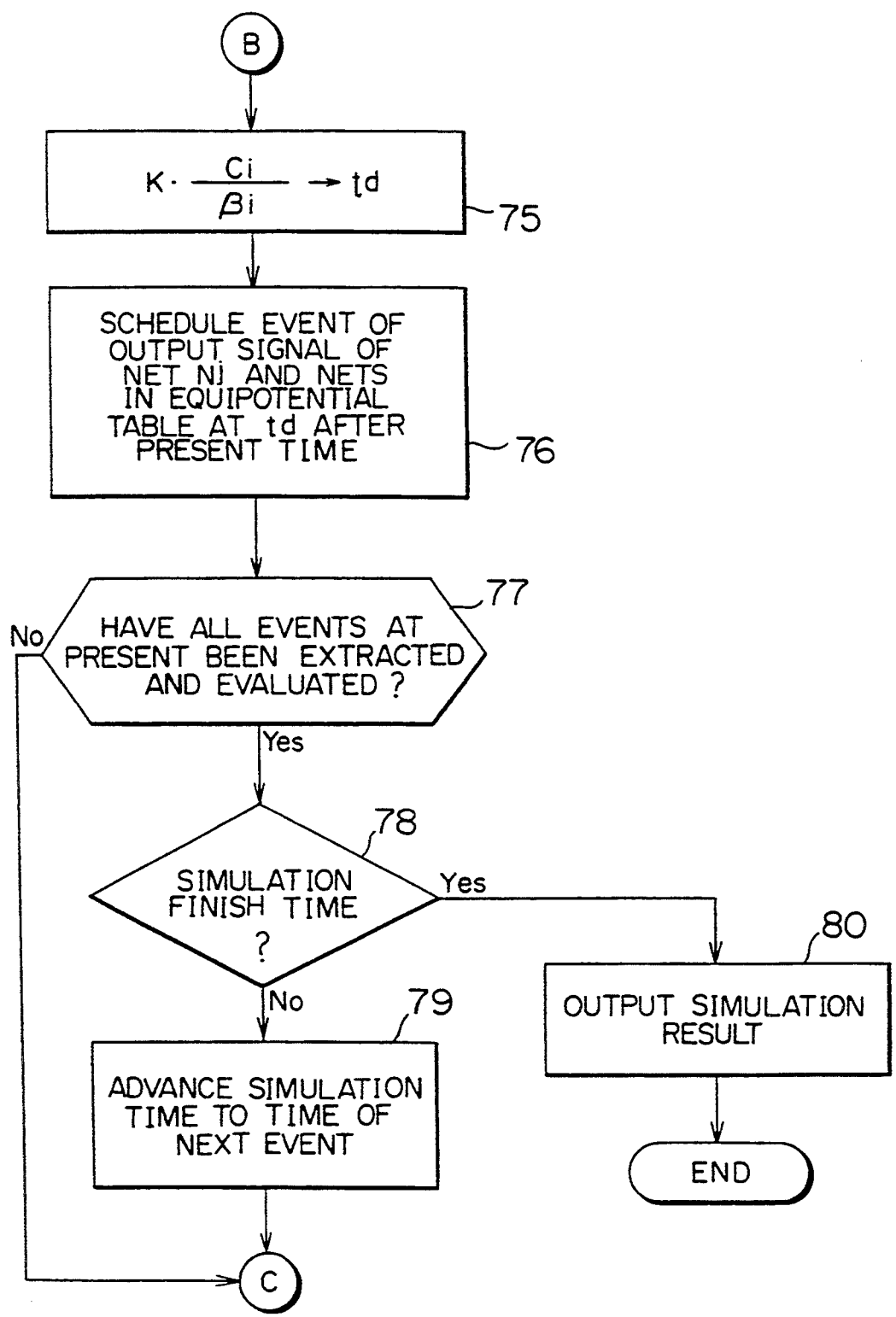
Figure 7:
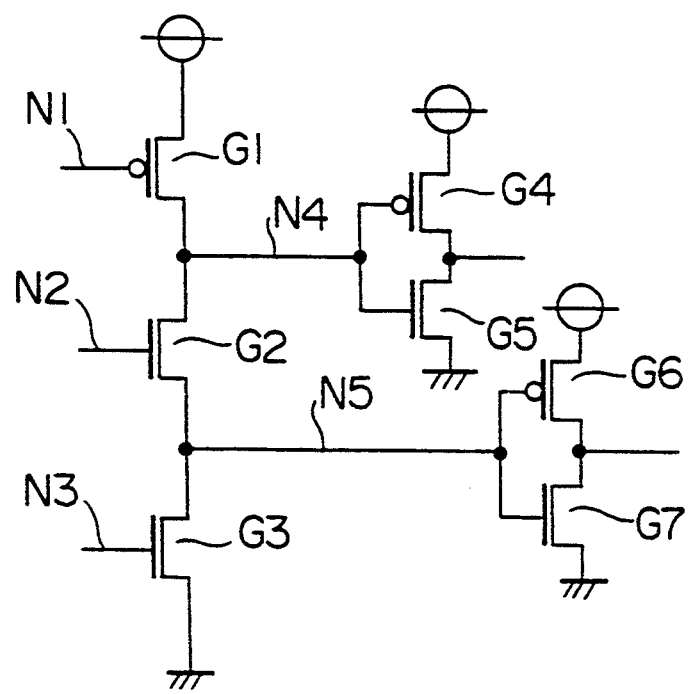
FIG. 7 is a diagram of a circuit to be simulated.
Figure 8:
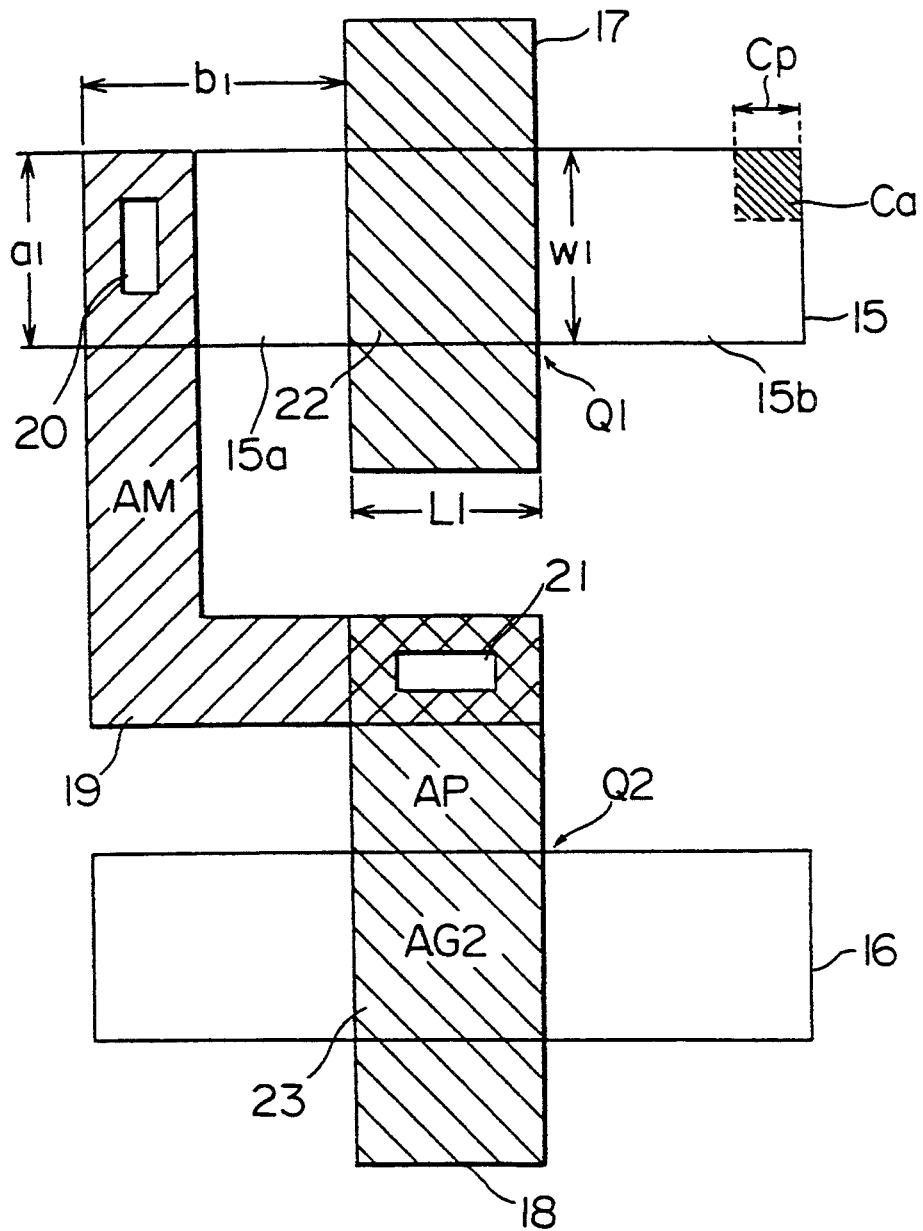
FIG. 8 is a view showing layout pattern data.

Operation of the timing simulation system according to the first embodiment will be described with reference to flow charts shown in FIGS. 2 to 4. As an example, the logic circuit shown in FIG. 7 is to be simulated. As described above, the logic circuit is comprised of the PMOS transistors G1, G4 and G6, the NMOS transistors G2, G3, G5 and G7, the input signal lines N1, N2 and N3 of the transistors G1, G2 and G3, the internal signal line N4 connected to a contact of the transistors G1 and G2, and the internal signal line N5 connected to a contact of the transistors G2 and G3. FIG. 8 shows the layout pattern data corresponding to the logic circuit shown in FIG. 7. Referring to FIG. 8, the layout pattern data includes the diffusion regions 15 and 16, the polysilicon regions 17 and 18, the aluminum (Al) wiring region 19, and the contact regions 20 and 21. The portions 22 and 23 where the diffusion regions 15 and 16 are overlaid on the polysilicon regions 17 and 18 designate the gate forming regions of the transistors Q1 and Q2. The transistors Q1 and Q2 each correspond to any of the transistors G1 to G7 shown in FIG. 7.

Figure 2:
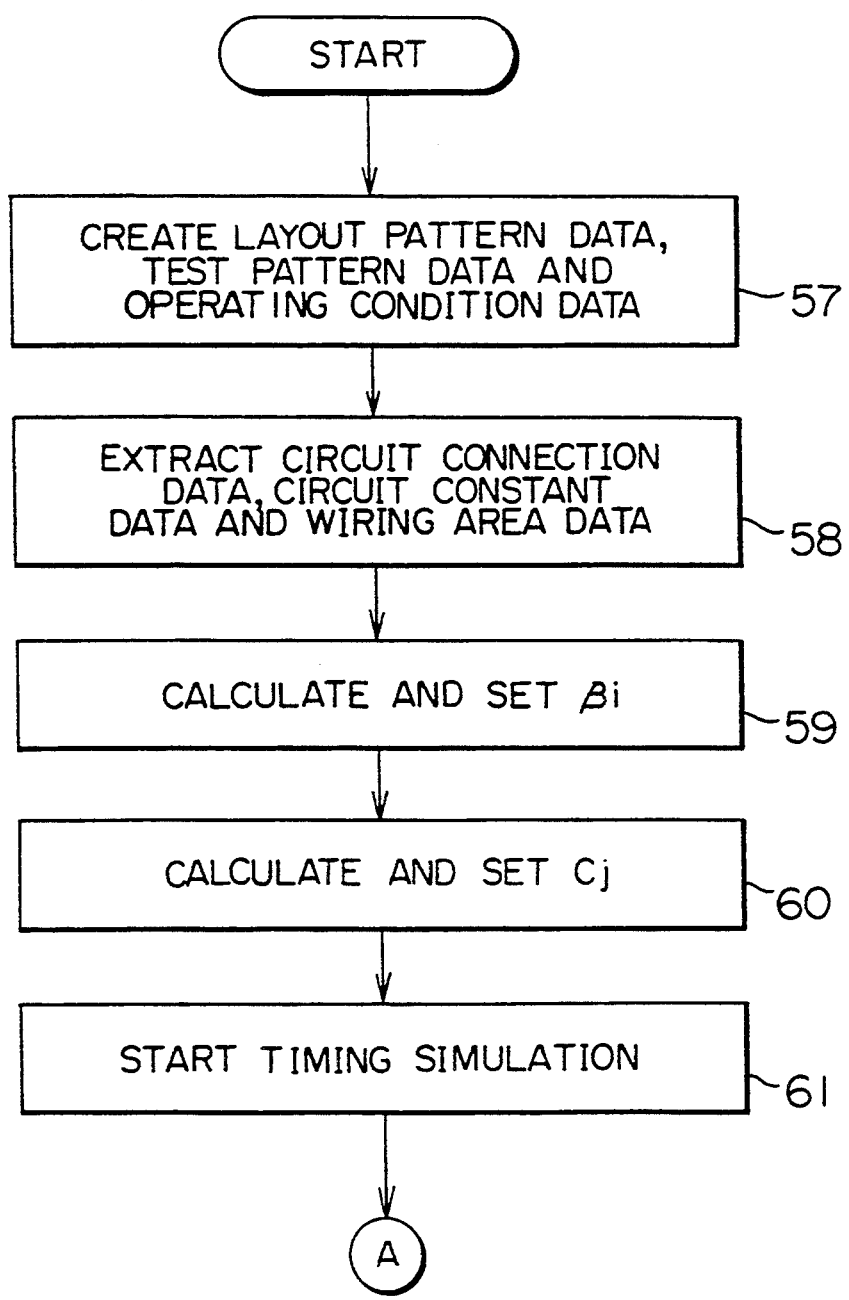
FIGS. 2, 3 and 4 are flow charts showing the operation of the first embodiment.

In Step 57 shown in FIG. 2, the circuit designer first creates layout pattern data equivalent to the logic circuit shown in FIG. 7 and stores the layout pattern data in the layout pattern data storage portion 41, and creates test pattern data and operating condition data and stores the test pattern data and the operating condition data in the input pattern data storage portion 52 and the operating condition data storage portion 53, respectively. Then, in Step 58, the data extracting portion 42 extracts circuit connection data, circuit constant data and wiring area data from the layout pattern data stored in the layout pattern data storage portion 41, and stores the circuit connection data, the circuit constant data and the wiring area data in the circuit connection data storage portion 50, the circuit constant data storage portion 43 and the wiring area data storage portion 44, respectively. As the circuit connection data, for example, data shown in the following Table 2 are extracted.

TABLE 2

| GATE=G1, | ETYPE=P, | G=N1, | SD=VDD, | SD=N4, | BETA=$\beta$1; |
|---|---|---|---|---|---|
| GATE=G2, | ETYPE=N, | G=N2, | SD=N4, | SD=N5, | BETA=$\beta$2; |
| GATE=G3, | ETYPE=N, | G=N3, | SD=N5, | SD=GND, | BETA=$\beta$3; |
| | | | | | | | | | | | |
| 81 | 82 | 83 | 84 | 85 | 86 |
| NET=N1, | C=C1; | | | | |
| NET=N2, | C=C2; | | | | |
| NET=N3, | C=C3; | | | | |
| NET=N4, | C=C4; | | | | |
| NET=N5, | C=C5; | | | | |
| | | | | | | | |
| 87 | 88 | | | | |

In Table 2, numerals 81 and 82 denote a gate name peculiar to an element, and a type of the element, respectively. P and N designate a PMOS transistor and an NMOS transistor, respectively. Numerals 83, 84 and 85 denote signal lines (nets) connected to a gate terminal, a source terminal and a drain terminal of the element. Numerals 86, 87 and 88 denote a gain coefficient set for the element, a net name, and an attendant capacity set for the net, respectively. However, the gain coefficient 86 and the attendant capacitance 88 are not yet set in Step 58 shown in FIG. 2.

As the circuit constant data, for example, the channel length $L_1$ and the channel width $W_1$ of the transistor Q1 shown in FIG. 8 are extracted, and as the wiring area data, for example, the width $a_1$ and the length $b_1$ of the drain diffusion region 15a of the transistor Q1, the area $A_M$ of the aluminum wiring region 19, the area $A_p$ of the polysilicon region 18, and the area $A_{G2}$ of the gate of the transistor Q2, are extracted.

In Step 59, the $\beta$ calculating portion 46 reads out the channel length $L_1$ and width $W_1$ of the transistor Gi stored in the circuit constant data storage portion 43 and the dielectric constant $\epsilon$ and the thickness $t_{ox}$ of a gate oxide film stored in the process parameter storage portion 45, and obtains a gain coefficient $\beta i$ of the transistor Gi based on these values and an effective surface mobility $\mu$ of electrons in the channel retained in the $\beta$ calculating portion 46 according to the following expression 1.

$$\beta i = (\mu\epsilon/t_{ox})\cdot(W_i/L_i) \quad (1)$$

The calculated gain coefficient $\beta i$ of the transistors Gi is set by the $\beta$ supply portion 48 in a designated field of the gain coefficient 86 of the circuit connection data stored in the circuit connection data storage portion 50.

On the other hand, in Step 60, the C calculating portion 47 reads data necessary for calculation out of the wiring area data storage portion 44 and the process parameter storage portion 45, and calculates the capacitance Cj of the net Nj. The calculation procedures will be described with reference to the circuit shown in FIG. 7.

For example, since the net N4 is connected to the drain terminals of the PMOS transistor G1 and the NMOS transistor G2 and the gate terminals of the PMOS transistor G4 and the NMOS transistor G5, the capacitance C4 of the net N4 is determined according to the following expression 2.

$$C4 = C_{M4} + C_{P4} + C_{P5} + C_{D1} + C_{D2} + C_{G4} + C_{G5} \quad (2)$$

In the expression (2), $C_{M4}$ designates the wiring capacitance of a capacitor composed of the aluminum wiring region 19 on the layout corresponding to the net N4, an insulating layer formed under the wiring region 19 and a semiconductor layer formed under the insulating layer, and it is calculated according the following expression 3.

$$C_{M4} = (\epsilon_1/t_1)A_1 \quad (3)$$

$\epsilon_1$ and $t_1$ designate the dielectric constant and thickness of the insulating layer, respectively, and $A_1$ designates the wiring area. The dielectric constant $\epsilon_1$ and thickness $t_1$ of the insulating layer are stored as process parameters in the process parameter storage portion 45, and the wiring area $A_1$ is stored in the wiring area data storage portion 44. Similarly, capacitances $C_{P4}$ and $C_{P5}$ of polysilicon regions of the transistors G4 and G5 are calculated.

On the other hand, $C_{D1}$ and $C_{D2}$ in the expression 2 designate capacitances of drain diffusion regions of the transistors G1 and G2, respectively. In general, a capacitance $C_D$ of the drain diffusion region or the source diffusion region of, for example, the transistor G1 shown in FIG. 8 can be calculated according to the following expression 4.

$$C_D = a_1 \cdot b_1 C_a + 2(a_1 + b_1)C_P \quad (4)$$

$a_1$ and $b_1$, which designate the width and length of the drain diffusion region, respectively, are stored in the wiring area data storage portion 44. $C_a$ and $C_p$, which designate the joint capacitance per unit area of the drain diffusion region and the semiconductor layer under the drain diffusion region and the peripheral capacitance per unit length of the drain diffusion region and the semiconductor layer around the drain diffusion region, respectively, are determined by the process parameters and the conductivity type of the transistor Q1. The conductivity type of the transistor Q1 can be obtained from the conductivity type of the diffusion region of the transistor Q1 in the layout pattern data shown in FIG. 8. The capacitances $C_{D1}$ and $C_{D2}$ of the drain diffusion regions of the transistors G1 and G2 are calculated by using the expression 4.

Furthermore, $C_{G4}$ and $C_{G5}$ in the expression 2 designate MOS gate capacitances of the transistors G4 and G5. In general, a MOS gate capacitance $C_G$ in a linear region which is most influential in the delay can be calculated according to the following expression 5.

$$C_G = (\epsilon/t_{OX})A_G \tag{5}$$

$\epsilon$ and $t_{OX}$ which designate the dielectric constant and thickness of the gate oxide film, respectively, are stored in the process parameter storage portion 45. On the other hand, $A_G$ designating the gate area is stored in the wiring area data storage portion 44. The MOS gate capacitances $C_{G4}$ and $C_{G5}$ of the transistors G4 and G5 are calculated by using the expression 5.

Thus, the attendant capacitance C4 of the net N4 can be calculated according to the expressions 2 to 5. Similarly, a capacitance Cj attendant on an arbitrary net Nj in the circuit can be expressed by the following expression 6, and the attendant capacitances of other nets Nj are calculated by using the expression 6 by the C calculating portion 47.

$$Cj = \frac{\epsilon_1}{t_1} \cdot A_1 + \sum_{l=1}^{k}\left(\frac{\epsilon_p}{t_p} \cdot A_p\right) + \sum_{n=1}^{m}\{a_n \cdot b_n \cdot C_a + 2(a_n + b_n)C_p\} + \sum_{l=1}^{k}\left(\frac{\epsilon}{t_{ox}} \cdot A_G\right) \tag{6}$$

In the expression 6, $\epsilon_p$, $t_p$, m and k designate the dielectric constant and thickness of the insulating layer formed right under the polysilicon region, the number of drain and source terminals connected to the net Nj, and the number of the gate terminals connected to the net Nj, respectively.

The attendant capacitance Cj of the net Nj which is thus calculated is set in a designated field of the attendant capacitance 88 in the circuit connection data stored in the circuit connection data storage portion 50.

Then, the timing simulation executing portion 51 reads out the test pattern data and the operating condition data which are created by the circuit designer in Step 57 and stored in the input pattern data storage portion 52 and the operating condition data storage portion 53, and starts timing simulation with respect to the circuit connection data stored in the circuit connection data storage portion 50 in Step S61.

Operation of the timing simulation executing portion 51 will now be described. First, a logic signal value change (event), which is caused on the net in the logic circuit by supplying the test pattern data to the circuit connection data, is extracted in Step 62. Then, in Step 63, input event evaluation in the transistor Gi in the next stage having an input terminal connected to the net is performed. In other words, it is checked whether an output signal value of the transistor Gi at present (a signal value on the net connected to the output terminal of the transistor Gi) changes due to the event arising in the input terminal of the transistor Gi. If it is determined in Step 64 that the output signal value of the transistor Gi does not change, Step 62 is repeated. If it is determined that the output signal value changes, the gain coefficient $\beta i$ of the transistor Gi and the attendant capacitance Cj of the net Nj connected to the output terminal of the transistor Gi are extracted in Step 65.

In Step 66, information on the terminal type (which of a drain terminal, a source terminal and a gate terminal is connected to the net Nj) and the element type of a transistor Gn in the next stage connected to the net Nj, and the on/off information of the transistor Gn at present, are extracted from the circuit connection data.

In subsequent Step 67, the terminal type and the on/off state of the next transistor Gn are distinguished. If the terminal type is a source terminal and the transistor Gn is ON, it is determined that the potential of a net Nm connected to the output terminal of the transistor Gn becomes equal to that of the net Nj, and Step 71 is executed. In other cases, it is determined that other nets are not equipotential, and Step 75 is executed. Since the MOS transistor is generally bidirectional with respect to the source and drain, it is normally unnecessary to distinguish between the source terminal and the drain terminal. Even if the terminal type of the transistor Gn is a drain terminal, it is determined that the condition of Step 67 is satisfied.

In Step 71, a gain coefficient $\beta n$ of the transistor Gn and an attendant capacitance Cm of the net Nm connected to the output terminal of the transistor Gn are extracted from the circuit connection data. In Step 72, the total load capacitance $C_{total}$ of the equipotential nets and the total gain coefficient $\beta_{total}$ of transistors for driving the nets are found.

The total load capacitance $C_{total}$ is calculated by substituting the attendant capacitances Cj and Cm of the nets Nj and Nm in the following expression 7, and held as a variable Cj.

$$C_{total} = Cj + Cm \tag{7}$$

On the other hand, if the transistors are serially connected to each other, the total gain coefficient $\beta_{total}$ can be found as follows. In general, a source-drain current $I_{ds}$ in the linear region of the MOS transistor is expressed by the following expression 8 according to a first approximation.

$$I_{ds} = \beta[(V_{gs} - V_t)V_{ds} - V_{ds}^2/2] \tag{8}$$

However, $0 < V_{ds} < V_{gs} - V_t$. $\beta$, $V_{gs}$, $V_{ds}$ and $V_t$ designate the gain coefficient of the transistor, the gate-source voltage, the drain-source voltage and the threshold voltage, respectively.

An output conductance of the transistor is found as shown in the following expression 9 by differentiating the expression 8 with respect to $V_{ds}$.

$$\lim_{V_{ds} \to 0} \frac{dI}{dV_{ds}} \approx \beta(V_{gs} - V_t) \tag{9}$$

Therefore, the output resistance (channel resistance) $R_c$ of the transistor can be approximated by the following expression 10.

$$R_c = 1/\beta(V_{gs} - V_t) \tag{10}$$

In short, the total output resistance $R_{total}$ of the transistors, which are serially connected to one another, is expressed by the following expression 11.

$$\begin{aligned} R_{total} &= R_i + R_n \\ &= \frac{1}{\beta_i(V_{gs} - V_t)} + \frac{1}{\beta_n(V_{gs} - V_t)} \\ &= \frac{1}{V_{gs} - V_t} \cdot \frac{\beta_i + \beta_n}{\beta_i \beta_n} \end{aligned} \tag{11}$$

Furthermore, according to the expression 10, the transistor gain coefficient $\beta$ in the linear region can be expressed by the following expression 12.

$$\beta = 1/R_c(V_{gs} - V_t) \tag{12}$$

Therefore, the total gain coefficient $\beta_{total}$ is expressed by the following expression 13 according to the expressions 11 and 12.

$$\beta_{total} = \beta_i \beta_n / (\beta_i + \beta_n) \tag{13}$$

The calculated total gain coefficient $\beta_{total}$ is retained as a variable $\beta_i$. If the transistors are connected in parallel, since the total output resistance $R_{total} = (\beta_i + \beta_n)\cdot(V_{gs} - V_t)$, the total gain coefficient $\beta_{total} = \beta_i + \beta_n$.

In Step 73, the name of the net Nj is stored as an equipotential net in an equipotential table. In Step 74, the equipotential net to be examined is changed from the transistor Gi to the next transistor Gn, the net is also changed from the net Nj to the next net Nm, and Step 66 is repeated.

The total load capacitance $C_{total}$ and the total gain coefficient $\beta_{total}$ are found as described above. If it is determined in Step 67 that no other net is equipotential, a delay time $t_d$ required for a logic signal change on the equipotential nets is calculated as follows in Step 75.

If it is assumed that the supply voltage is $V_{dd}$ and the rise time of a signal value means the time in which the output voltage $V_0$ changes from 0.9 $V_{dd}$ to 0.1 $V_{dd}$, since the charge $Q = CV_0$ is discharged with $I_{ds} = \beta(V_{gs} - V_t)/2$, the following expression 14 is generally valid in a saturated region where $V_0 \geq V_{dd} - V_t$.

$$C(dV_0/dt) + \beta(V_{dd} - V_t)^2/2 = 0 \tag{14}$$

The fall time $t_{f1}$ of the saturated region is found as shown in the following expression 15 by differentiating the expression 14 with respect to the output voltage $V_0$ from 0.9 $V_{dd}$ to $V_{dd} - V_t$.

$$t_{f1} = 2 \frac{C}{\beta(V_{dd} - V_t)^2} \int_{V_{dd} - V_t}^{0.9 V_{dd}} dV_0 = \frac{2C(V_t - 0.1 V_{dd})}{\beta(V_{dd} - V_t)^2} \tag{15}$$

On the other hand, since the charge $Q = CV_0$ is discharged with $I_{ds} = \beta[(V_{gs} - V_t)V_{ds} - V_{ds}^2/2]$, the following expression 16 is generally valid in an unsaturated region where $V_0 < V_{dd} - V_t$.

$$C(dV_0/dt) + \beta\{(V_{dd} - V_t)V_0 - V_0^2/2\} = 0 \tag{16}$$

The fall time $t_{f2}$ of the unsaturated region is found as shown in the following expression 17 by differentiating the expression 16 with respect to the output voltage $V_0$ from $V_{dd} - V_t$ to 0.1 $V_{dd}$.

$$t_{f2} = \frac{C}{\beta(V_{dd} - V_t)} \int_{0.1 V_{dd}}^{V_{dd} - V_t} \frac{dV_0}{V_0 - V_0^2/2(V_{dd} - V_t)} \tag{17}$$

$$= \frac{C}{\beta(V_{dd} - V_t)} \ln \frac{19 V_{dd} - 20 V_t}{V_{dd}}$$

Therefore, the fall time $t_f$ is expressed by the following expression 18.

$$t_f = t_{f1} + t_{f2} \tag{18}$$

$$= \frac{2C}{\beta(V_{dd} - V_t)} \left\{ \frac{V_t - 0.1 V_{dd}}{V_{dd} - V_t} + \frac{1}{2} \ln \frac{19 V_{dd} - 20 V_t}{V_{dd}} \right\}$$

If it is assumed that $V_t = 0.2 V_{dd}$ in the expression 18, the fall time $t_f = 3.7C/\beta V_{dd}$. Similarly, if it is assumed that $|V_t| = 0.2 V_{dd}$, the rise time $t_r = 3.7C/\beta V_{dd}$.

If the delay time $t_d$ is defined as the time of transition from a 50% value of the input level to a 50% value of the output level, it is expressed by the following expression 19.

$$t_d = t_f/2 = t_r/2 = 3.7C/2\beta V_{dd} \tag{19}$$

When the temperature t of the MOS transistor rises, the effective carrier mobility $\mu$ in the channel is decreased. Therefore, the following expression 20 is generally valid, in which k is a constant.

$$\beta = kt^{-3/2} \tag{20}$$

Furthermore, if it is assumed that a function f(p) of the process dispersion variable p in the production process with respect to the delay can be approximately defined, the delay time $t_d$ is found as shown in the following expression 21 according to the above expressions 19 and 20.

$$t_d = \frac{3.7}{2k} \cdot \frac{C_{total}}{\beta_{total}} \cdot \frac{t^{3/2}}{V_{dd}} \cdot f(p) \tag{21}$$

Since the process variable p does not vary during one simulation executing process, the value of the function f(p) is calculated and set as a constant in a preprocess of the simulation.

Furthermore, if the temperature t of the MOS transistor and the supply voltage $V_{dd}$ each are constant in the operation of the circuit, the above expression 21 can be changed into the following expression 22.

$$t_d = K \cdot C_{total}/\beta_{total} \tag{22}$$

K is a constant expressed by the following expression 23 and can be calculated in a preprocess of the simulation.

$$K = \frac{3.7}{2k} \cdot \frac{t^{3/2}}{V_{dd}} \cdot f(p) \tag{23}$$

In Step 76, events of output signals related to the net Nj and nets in the equipotential table are at the time $t_d$ after the present simulation time. After that, it is determined in Step 77 whether all the events at the present simulation time have been extracted and evaluated. If all the events have not not been extracted and evaluated, the next event is extracted in Step 62. On the other hand, if it is determined in Step 77 that all the events have been extracted and evaluated, it is determined in Step 78 whether the present simulation time has reached a simulation finish time preset by the circuit designer.

If it is determined that the present simulation time has not reached yet, after the simulation time is advanced by the timing simulation executing portion 51 to the time when the next event arises, Step 62 is repeated. If it is determined in Step 78 that the present simulation time has reached the simulation finish time, the simulation result output portion 54 displays the simulation result information necessary to determine whether the circuit has normally operated, such as signal value change information, for the circuit designer in Step 80.

Although the timing simulation executing portion 51 calculates the delay time $t_d$ by using the expression 22 in the above embodiment, if the simulation is carried out in an environment where the temperature t of the MOS transistor changes during the operation of the circuit, the delay time $t_d$ may be calculated according to the following expression 24. In the expression 24, $K_1$ is a constant which is found from $K_1 = 3.7f(p)/2kV_{dd}$, a and b are constants, and $t_A$ denotes a simulation absolute time.

$$t_d = K_1(C_{total}/\beta_{total})\cdot(a\cdot t_a+b)^{3/2} \quad (24)$$

If the simulation is carried out in an environment where the supply voltage $V_{dd}$ cyclically changes during the operation of the circuit, the delay time $t_d$ may be calculated according to the following expression 25. In the expression 24, $K_2$ is a constant which is found from $K_2 = 3.7t^{3/2} f(p)/2k$, a and b are constants, and $t_A$ denotes a simulation absolute time.

$$t_d = K_2 \cdot \frac{C_{total}}{\beta_{total}} \cdot \frac{1}{V_{dd}\{1 + a \cdot \sin(b \cdot t_A/2\pi)\}} \quad (25)$$

Figure 5:
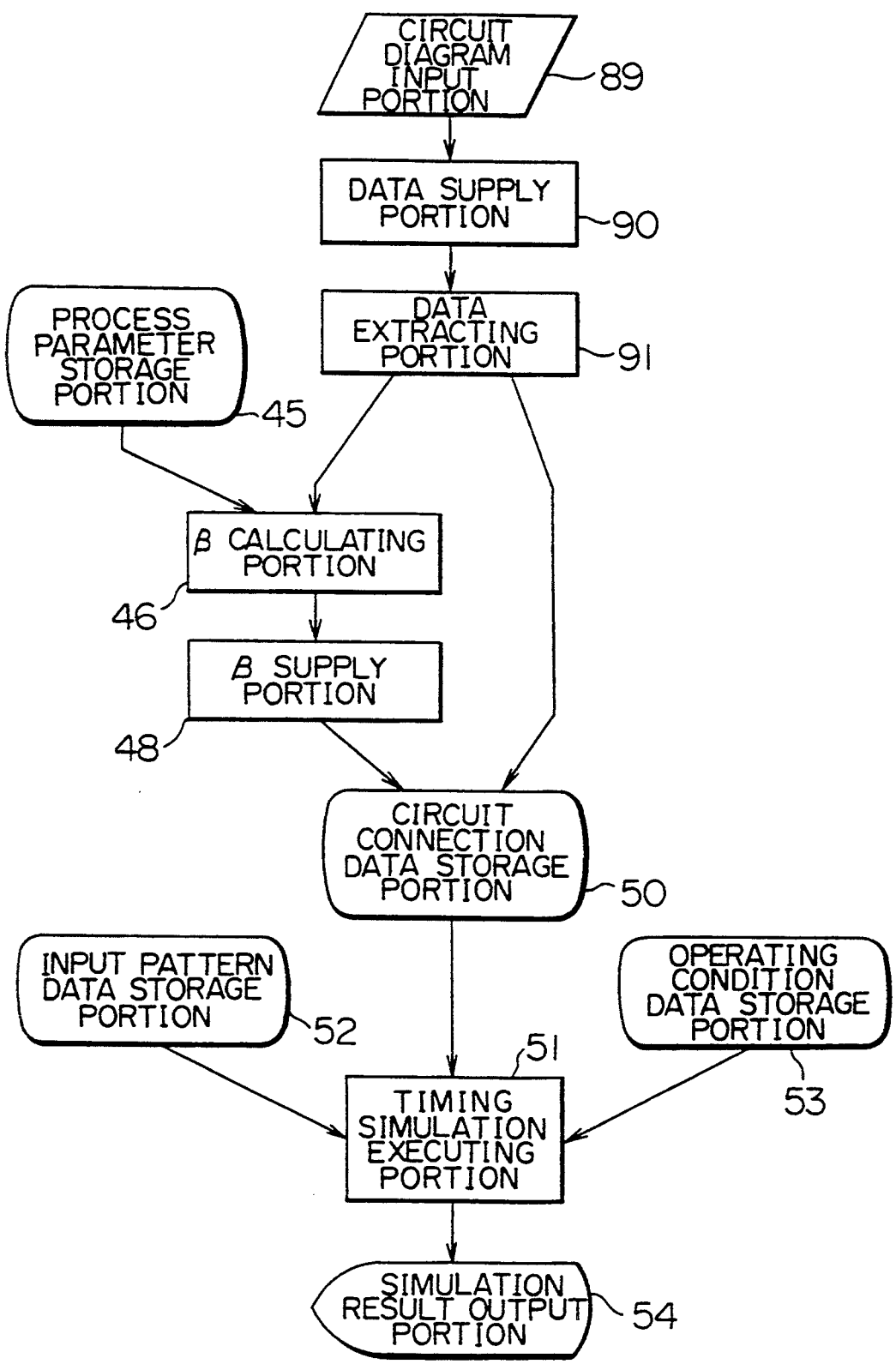
FIG. 5 is a block diagram of a timing simulation system according to a second embodiment of the present invention.
Figure 6:
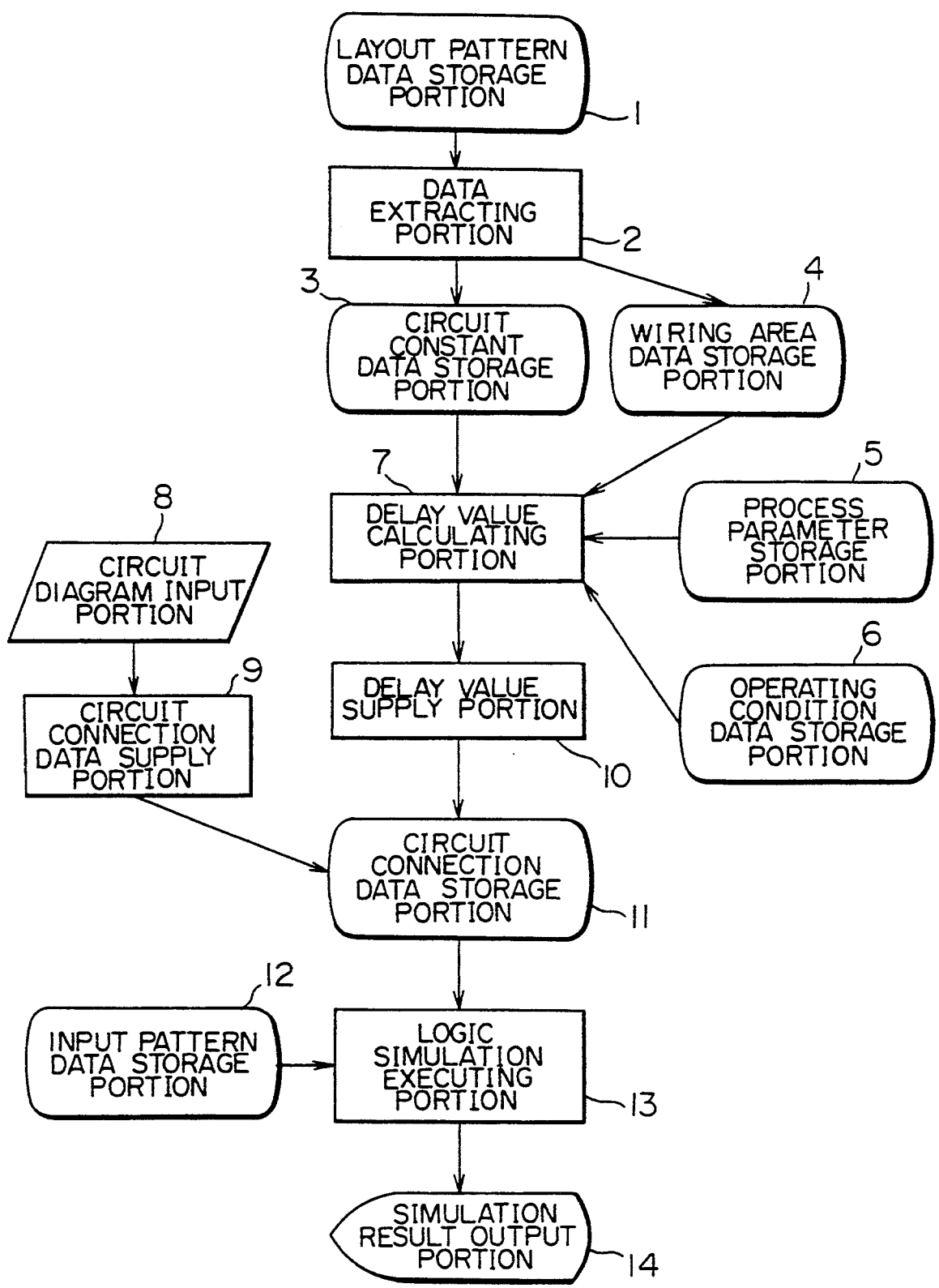
FIG. 6 is a block diagram of a conventional timing simulation system.

FIG. 5 is a block diagram of a timing simulation system according to a second embodiment of the present invention. Although the layout pattern data is simulated in the system shown in FIG. 1, the circuit designer directly supplies circuit constant data and an attendant capacitance to circuit connection data and the mixed data is simulated in the second embodiment. This makes it possible to verify the circuit design before the layout is arranged. A data supply portion 90 is connected to a circuit diagram input portion 89 to which the circuit designer can input circuit diagram data equivalent to a logic circuit. The data supply portion 90 supplies circuit constant data of transistors and appropriate attendant capacitances Cj of nets to the circuit diagram data input from the circuit diagram input portion 89. The data supply portion 90 is connected to a data extracting portion 91 for extracting circuit connection data from the circuit diagram data, and the data extracting portion 91 is connected to a $\beta$ calculating portion 46. Besides the $\beta$ calculating portion 46, a process parameter storage portion 45, a $\beta$ supply portion 48, a circuit connection data storage portion 50, a timing simulation executing portion 51, an input pattern data storage portion 52, an operating condition data storage portion 53 and a simulation result output portion 54 are the same as the components denoted by like numerals shown in FIG. 1.

In the second embodiment, when the circuit designer inputs circuit diagram data from the circuit diagram input portion 89, circuit constant data of transistors constituting a logic circuit and attendant capacitances Cj of nets are supplied to the circuit diagram data by the data supply portion 90. Subsequently, circuit connection data is extracted from the circuit diagram data by the data extracting portion 91 and stored in the circuit connection data storage portion 50. The $\beta$ calculating portion 46 calculates gain coefficients $\beta i$ of the transistors based on the circuit constant data supplied by the data supply portion 90 and process parameters stored in the process parameter storage portion 45 and the $\beta$ supply portion 48 supplies the gain coefficients $\beta i$ to the circuit connection data. The timing simulation executing portion 51 performs timing simulation with respect to the circuit connection data in the same manner as in the first embodiment.

According to the second embodiment described above, it is possible to verify the circuit design before the layout is arranged by virtually supplying an appropriate capacitance Cj to each net.

What is claimed is:

1. A timing simulation system comprising:
   a layout pattern data storage portion for storing layout pattern data defining a layout pattern of a logic circuit;
   a data extracting portion for extracting circuit connection data defining connections among elements of said logic circuit, circuit constant data of said elements, and wiring area data including dimensions of wires between said elements from the layout pattern data stored in said layout pattern data storage portion;
   a process parameter storage portion for storing process parameters necessary for production of said logic circuit;
   a gain coefficient calculating portion for calculating gain coefficients representing output conductances of said elements based on the circuit constant data extracted by said data extracting portion and the process parameters stored in said process parameter storage portion;
   an attendant capacitance calculating portion for calculating capacitances of said wires based on the wiring area data extracted by said data extracting portion and the process parameters stored in said process parameter storage portion;
   a gain coefficient supply portion for assigning the gain coefficients calculated by said gain coefficient calculating portion to said elements in the circuit connection data extracted by said data extracting portion;
   an attendant capacitance supply portion for assigning the capacitances calculated by said attendant capacitance calculating portion to said wires in the circuit connection data extracted by said data extracting portion; and
   a timing simulation executing portion for calculating a total load capacitance of a group of equipotential wires, the total load capacitance dynamically changing in accordance with whether said elements are conducting when input signals are applied to said elements, and for calculating a total gain coefficient of a group of said elements for driving said wires with respect to the circuit connection data including the gain coefficients and the attendant capacitances by said gain coefficient supply portion and said attendant capacitance supply portion, for dynamically calculating a transition time of a signal state generated on each of said wires according to operation of said circuit, and for timing simulation while regarding the transition time as a delay time necessary for propagation of a logic signal to an element in a succeeding circuit connected to said logic circuit.

2. The timing simulation system according to claim 1 comprising an input pattern data storage portion for storing test pattern data for evaluation of said logic circuit, wherein said timing simulation executing portion receives the test pattern data stored in said input pattern data storage portion and the circuit connection data supplied with the gain coefficients and the attendant capacitances, identifies signal lines in said logic circuit in which a logic signal change occurs, and determines whether an output signal value of an element having an input terminal connected to an identified signal line changes.

3. The timing simulation system according to claim 1 comprising an operating condition data storage portion for storing operating condition data to be supplied to the circuit connection data, wherein said timing simulation executing portion supplies the operating condition data stored in said operating condition data storage portion to the circuit connection data supplied with the gain coefficients and the attendant capacitances.

4. The timing simulation system according to claim 1 wherein said timing simulation executing portion calculates a transition time of a signal value state by integrating output voltages of said group of equipotential wires.

5. A timing simulation system comprising:

a circuit diagram input portion for inputting circuit diagram data equivalent to a logic circuit;

a data supply portion for supplying circuit constant data of elements of said logic circuit and capacitances of wires between said elements to the circuit diagram data input by said circuit diagram input portion;

a data extracting portion for extracting circuit connection data defining connections among said elements from the circuit diagram data input by said circuit diagram input portion;

a process parameter storage portion for storing process parameters necessary for production of said logic circuit;

a gain coefficient calculating portion for calculating gain coefficients representing output conductances of said elements based on the circuit constant data supplied by said data supply portion and the process parameters supplied by said process parameter storage portion;

a gain coefficient supply portion for assigning the gain coefficients calculated by said gain coefficient calculating portion to said elements in the circuit connection data extracted by said data extracting portion; and a timing simulation executing portion for calculating a total load capacitance of a group of equipotential wires, the total load capacitance dynamically changing in accordance with whether said elements are conducting when input signals are applied to said elements, and for calculating a total gain coefficient of a group of said elements for driving said wires with respect to the circuit connection data including the gain coefficients and the attendant capacitances by said gain coefficient supply portion and said attendant capacitance supply portion, for dynamically calculating a transition time of a signal state generated on each of said wires according to operation of said circuit, and for timing simulation while regarding the transition time as a delay time necessary for propagation of a logic signal to an element in a succeeding circuit connected to said logic circuit.

6. The timing simulation system according to claim 5 comprising an input pattern data storage portion for storing test pattern data for evaluation of said logic circuit, wherein said timing simulation executing portion receives the test pattern data stored in said input pattern data storage portion and the circuit connection data supplied with the gain coefficients and the attendant capacitances, identifies signal lines in said logic circuit in which a logic signal change occurs, and determines whether an output signal value of an element having an input terminal connected to an identified signal line changes.

7. The timing simulation system according to claim 5 comprising an operating condition data storage portion for storing operating condition data to be supplied to the circuit connection data, wherein said timing simulation executing portion supplies the operating condition data stored in said operating condition data storage portion to the circuit connection data supplied with the gain coefficients and the attendant capacitances.

8. The timing simulation system according to claim 5 wherein said timing simulation executing portion calculates a transition time of a signal value state by integrating output voltages of said group of equipotential wires.

* * * * *